(12) United States Patent
Suzuki

(10) Patent No.: US 10,809,515 B2
(45) Date of Patent: Oct. 20, 2020

(54) OBSERVATION METHOD AND SPECIMEN OBSERVATION APPARATUS

(71) Applicant: JEOL Ltd., Tokyo (JP)

(72) Inventor: Katsuyuki Suzuki, Tokyo (JP)

(73) Assignee: JEOL Ltd., Tokyo (JP)

( * ) Notice: Subject to any disclaimer, the term of this patent is extended or adjusted under 35 U.S.C. 154(b) by 16 days.

(21) Appl. No.: 15/716,914

(22) Filed: Sep. 27, 2017

(65) Prior Publication Data

US 2018/0088306 A1 Mar. 29, 2018

(30) Foreign Application Priority Data

Sep. 28, 2016 (JP) .................. 2016-189826

(51) Int. Cl.
| | | |
|---|---|---|
| *H01J 37/28* | (2006.01) | |
| *G02B 21/36* | (2006.01) | |
| *H01J 37/26* | (2006.01) | |
| *G02B 27/32* | (2006.01) | |
| *G02B 21/34* | (2006.01) | |
| *G02B 21/02* | (2006.01) | |
| *G02B 21/26* | (2006.01) | |

(Continued)

(52) U.S. Cl.
CPC ......... *G02B 21/365* (2013.01); *G02B 21/025* (2013.01); *G02B 21/26* (2013.01); *G02B 21/34* (2013.01); *G02B 27/32* (2013.01); *H01J 37/20* (2013.01); *H01J 37/265* (2013.01); *H01J 37/28* (2013.01); *G06K 9/00134* (2013.01); *G06K 2009/3225* (2013.01); *H01J 2237/20285* (2013.01); *H01J 2237/20292* (2013.01); *H01J 2237/2813* (2013.01)

(58) Field of Classification Search
CPC .... G02B 21/365; G02B 21/025; G02B 21/26; G02B 21/34; G02B 27/32; H01J 37/20; H01J 37/265; H01J 37/28
See application file for complete search history.

(56) References Cited

U.S. PATENT DOCUMENTS

2011/0216183 A1* 9/2011 Yokomachi ............ G02B 21/16
 348/79
2012/0183198 A1* 7/2012 Zahniser ............ G06K 9/00134
 382/133

(Continued)

FOREIGN PATENT DOCUMENTS

JP 613011 A 1/1994

*Primary Examiner* — Jonathan R Messmore
(74) *Attorney, Agent, or Firm* — The Webb Law Firm

(57) ABSTRACT

Provided is an observation method including: acquiring an observed image that has been photographed by the first specimen observation apparatus with the specimen holder being mounted on the first specimen stage, the observed image having an observation target position of a specimen positioned at a center thereof, and including the plurality of markers (Step S104); acquiring pixel coordinates of each of the plurality of markers in the observed image (Step S106); acquiring stage coordinates of each of the plurality of markers on the second specimen stage having the specimen holder mounted thereon (Step S108); and converting, based on the pixel coordinates of the plurality of markers and the stage coordinates of the plurality of markers, pixel coordinates of the center of the observed image into stage coordinates to move the second specimen stage to the obtained stage coordinates (Step S112).

8 Claims, 15 Drawing Sheets

(51) Int. Cl.
 H01J 37/20 (2006.01)
 G06K 9/00 (2006.01)
 G06K 9/32 (2006.01)

(56) References Cited

U.S. PATENT DOCUMENTS

2013/0336574 A1* 12/2013 Nasser-Ghodsi ....... G06T 7/001
 382/145
2015/0003722 A1* 1/2015 Otani ................ G02B 21/0004
 382/149

* cited by examiner

OBSERVATION METHOD AND SPECIMEN OBSERVATION APPARATUS

Japanese Patent Application No. 2016-189826, filed on Sep. 28, 2016, is hereby incorporated by reference in its entirety.

BACKGROUND OF THE INVENTION

The present invention relates to an observation method and a specimen observation apparatus.

There has been known an observation system used to observe the same spot with an optical microscope and a scanning electron microscope or other such surface observation apparatus (see, for example, Japanese Patent Application Publication No. 6-13011).

FIG. 23 is a functional block diagram of an observation system 1 including an optical microscope 2 and a scanning electron microscope 4 according to the related art.

The optical microscope 2 includes a charge coupled device (CCD) camera 2a, an electric motor stage (specimen stage) 2b, and a control personal computer (PC) 2c. An observed image that has been photographed by the CCD camera 2a is recorded in the control PC 2c. Coordinates of the electric motor stage 2b at a time when the observed image is photographed are also recorded in the control PC 2c.

The scanning electron microscope 4 includes an electric motor stage (specimen stage) 4a and a control PC 4b.

Now, an observation method using the observation system 1 is described.

First, a common specimen holder having markers formed thereon is prepared, and a specimen is fixed on the common specimen holder. Next, the common specimen holder is mounted on the electric motor stage 2b of the optical microscope 2. Then, the markers are observed with the optical microscope 2. Coordinates of the electric motor stage 2b at this time are recorded in the control PC 2c. Next, the specimen is observed with the optical microscope 2 to determine an observation target position of the specimen, and an image of the observation target position is photographed with the CCD camera 2a. The observed image that has been photographed is recorded in the control PC 2c. The coordinates of the electric motor stage 2b at this time are also recorded in the control PC 2c.

Next, the common specimen holder having the specimen fixed thereon is removed from the electric motor stage 2b of the optical microscope 2, and is mounted on the electric motor stage 4a of the scanning electron microscope 4. Moreover, data on the coordinates of the markers, the observed image of the observation target position, and the coordinates of the observation target position, which has been recorded in the control PC 2c, is sent to the control PC 4b.

Next, the markers of the common specimen holder are searched for with the scanning electron microscope 4 to observe the markers. Coordinates of the electric motor stage 4a at this time are recorded in the control PC 4b. Then, based on the coordinates of the markers obtained by the optical microscope 2 and the coordinates of the markers obtained by the scanning electron microscope 4, coordinate conversion factors are calculated. Then, with the use of the coordinate conversion factors, the coordinates of the observation target position that have been obtained by the optical microscope 2 are converted into coordinates of the electric motor stage 4a of the scanning electron microscope 4. The control PC 4b moves the electric motor stage 4a to the obtained coordinates. As a result, the observation target position of the specimen that has been observed with the optical microscope 2 can be observed with the scanning electron microscope 4.

In the above-mentioned observation system 1, the data on the coordinates of the markers and the coordinates of the observation target position of the specimen needs to be read in the optical microscope 2. Therefore, a device (e.g., electric motor stage) configured to read the coordinates of the markers and the coordinates of the observation target position of the specimen has been required. In addition, there has been a need to observe each of the markers with the optical microscope 2, and to record information on the coordinates of the electric motor stage 2b at that time.

SUMMARY

The present invention is capable of providing an observation method with which, in an observation system including two specimen observation apparatus, an observation target position of a specimen that has been observed with one specimen observation apparatus can easily be observed with another specimen observation apparatus. The present invention is also capable of providing a specimen observation apparatus, with which an observation target position of a specimen that has been observed with an external specimen observation apparatus can easily be observed.

According to a first embodiment of the present invention, there is provided an observation method, in which a first specimen observation apparatus including a first specimen stage, on which a specimen holder having a plurality of markers formed thereon is mountable, and a second specimen observation apparatus including a second specimen stage, on which the specimen holder is mountable, are used to observe a spot that has been observed with the first specimen observation apparatus through use of the second specimen observation apparatus, the observation method including:
acquiring an observed image that has been photographed by the first specimen observation apparatus with the specimen holder being mounted on the first specimen stage, the observed image having an observation target position of a specimen positioned at a center thereof, and including the plurality of markers;
acquiring pixel coordinates of each of the plurality of markers in the observed image;
acquiring stage coordinates of each of the plurality of markers on the second specimen stage having the specimen holder mounted thereon; and
converting, based on the pixel coordinates of the plurality of markers and the stage coordinates of the plurality of markers, pixel coordinates of the center of the observed image into stage coordinates to move the second specimen stage to the obtained stage coordinates.

According to a second embodiment of the present invention, there is provided an observation method, in which a first specimen observation apparatus including a first specimen stage, on which a specimen holder having a marker formed thereon is mountable, and a second specimen observation apparatus including a second specimen stage, on which the specimen holder is mountable, are used to observe a spot that has been observed with the first specimen observation apparatus through use of the second specimen observation apparatus, the observation method including:
acquiring a reference image that has been photographed by the first specimen observation apparatus with the specimen holder being mounted on the first specimen stage such that a center of the first specimen stage and a reference point of the specimen holder match with each other, the reference image having the reference point of the specimen holder positioned at a center thereof, and including the marker;

acquiring an observed image that has been photographed by the first specimen observation apparatus with the specimen holder being mounted on the first specimen stage such that the center of the first specimen stage and the reference point of the specimen holder match with each other, the observed image having an observation target position of a specimen positioned at a center thereof, and including the marker;

acquiring pixel coordinates of the marker in the reference image and pixel coordinates of the marker in the observed image; and calculating, based on differences between the pixel coordinates of the marker in the reference image and the pixel coordinates of the marker in the observed image, amounts of movement of the second specimen stage to move the second specimen stage.

According to a third embodiment of the present invention, there is provided a specimen observation apparatus, which is used to observe an observation target position that has been observed with an external specimen observation apparatus including a first specimen stage, on which a specimen holder having a plurality of markers formed thereon is mountable, the specimen observation apparatus including:

a second specimen stage, on which the specimen holder is mountable;

an observed image acquisition unit configured to acquire an observed image that has been photographed by the external specimen observation apparatus with the specimen holder being mounted on the first specimen stage, the observed image having an observation target position of a specimen positioned at a center thereof, and including the plurality of markers;

a pixel coordinate acquisition unit configured to acquire pixel coordinates of each of the plurality of markers in the observed image;

a stage coordinate acquisition unit configured to acquire stage coordinates of each of the plurality of markers on the second specimen stage having the specimen holder mounted thereon; and a specimen stage control unit configured to convert, based on the pixel coordinates of the plurality of markers and the stage coordinates of the plurality of markers, pixel coordinates of the center of the observed image into stage coordinates to move the second specimen stage to the obtained stage coordinates.

According to a fourth embodiment of the present invention, there is provided a specimen observation apparatus, which is used to observe an observation target position that has been observed with an external specimen observation apparatus including a first specimen stage, on which a specimen holder having a marker formed thereon is mountable, the specimen observation apparatus including:

a second specimen stage, on which the specimen holder is mountable;

a reference image acquisition unit configured to acquire a reference image that has been photographed by the external specimen observation apparatus with the specimen holder being mounted on the first specimen stage such that a center of the first specimen stage and a reference point of the specimen holder match with each other, the reference image having the reference point of the specimen holder positioned at a center thereof, and including the marker;

an observed image acquisition unit configured to acquire an observed image that has been photographed by the external specimen observation apparatus with the specimen holder being mounted on the first specimen stage such that the center of the first specimen stage and the reference point of the specimen holder match with each other, the observed image having an observation target position of a specimen positioned at a center thereof, and including the marker;

a pixel coordinate acquisition unit configured to acquire pixel coordinates of the marker in the reference image and pixel coordinates of the marker in the observed image; and a specimen stage control unit configured to calculate, based on differences between the pixel coordinates of the marker in the reference image and the pixel coordinates of the marker in the observed image, amounts of movement of the second specimen stage to move the second specimen stage.

Figure 1:
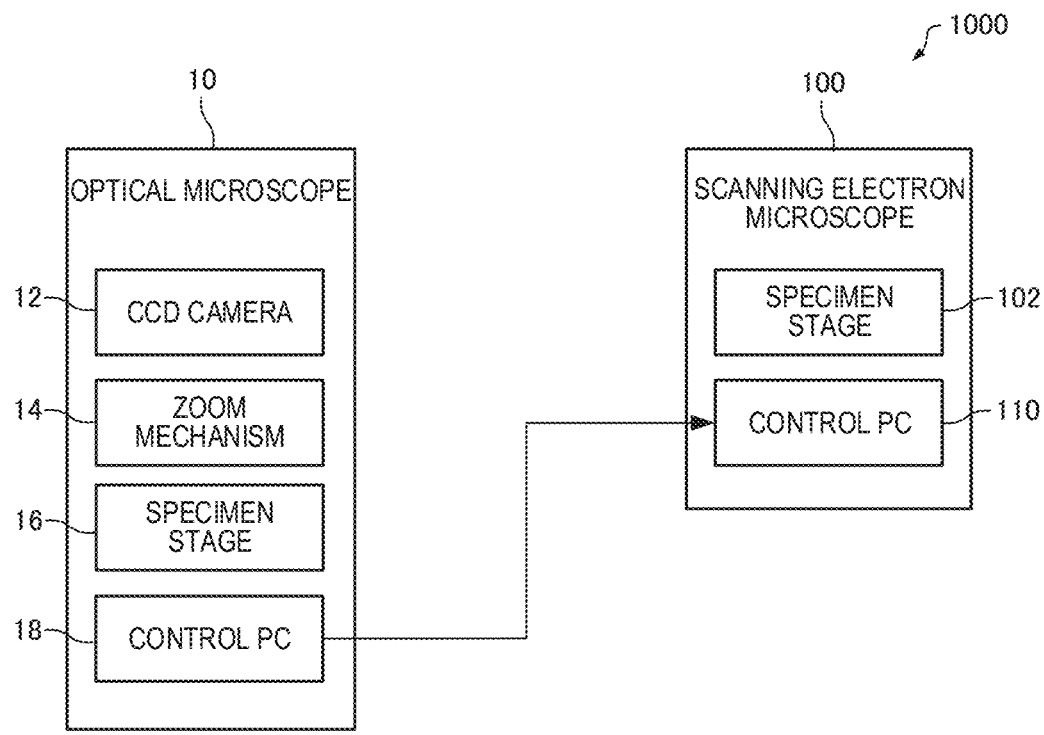
FIG. 1 is a functional block diagram of an observation system including a scanning electron microscope according to a first embodiment of the present invention.

DETAILED DESCRIPTION OF THE EMBODIMENT (1) According to one embodiment of the present invention, there is provided an observation method, in which a first specimen observation apparatus including a first specimen stage, on which a specimen holder having a plurality of markers formed thereon is mountable, and a second specimen observation apparatus including a second specimen stage, on which the specimen holder is mountable, are used to observe a spot that has been observed with the first specimen observation apparatus through use of the second specimen observation apparatus, the observation method including:
acquiring an observed image that has been photographed by the first specimen observation apparatus with the specimen holder being mounted on the first specimen stage, the observed image having an observation target position of a specimen positioned at a center thereof, and including the plurality of markers;
acquiring pixel coordinates of each of the plurality of markers in the observed image;
acquiring stage coordinates of each of the plurality of markers on the second specimen stage having the specimen holder mounted thereon; and
converting, based on the pixel coordinates of the plurality of markers and the stage coordinates of the plurality of markers, pixel coordinates of the center of the observed image into stage coordinates to move the second specimen stage to the obtained stage coordinates.

According to the above-mentioned observation method, based on the observed image that has been photographed by the first specimen observation apparatus, the specimen stage of the second specimen observation apparatus can be moved to the observation target position of the specimen that has been observed with the first specimen observation apparatus. In other words, according to the above-mentioned observation method, information on the stage coordinates of the observation target position and the stage coordinates of the markers in the first specimen observation apparatus is not required. Therefore, according to the above-mentioned observation method, the observation target position of the specimen that has been observed with the first specimen observation apparatus can easily be observed through use of the second specimen observation apparatus. Moreover, according to the above-mentioned observation method, there is no need to integrate a device (e.g., electric motor stage) capable of reading the stage coordinates into the first specimen observation apparatus, and the observation system including the first specimen observation apparatus and the second specimen observation apparatus can be implemented easily and inexpensively.

(2) According to one embodiment of the present invention, there is provided an observation method, in which a first specimen observation apparatus including a first specimen stage, on which a specimen holder having a marker formed thereon is mountable, and a second specimen observation apparatus including a second specimen stage, on which the specimen holder is mountable, are used to observe a spot that has been observed with the first specimen observation apparatus through use of the second specimen observation apparatus, the observation method including:
acquiring a reference image that has been photographed by the first specimen observation apparatus with the specimen holder being mounted on the first specimen stage such that a center of the first specimen stage and a reference point of the specimen holder match with each other, the reference image having the reference point of the specimen holder positioned at a center thereof, and including the marker;
acquiring an observed image that has been photographed by the first specimen observation apparatus with the specimen holder being mounted on the first specimen stage such that the center of the first specimen stage and the reference point of the specimen holder match with each other, the observed image having an observation target position of a specimen positioned at a center thereof, and including the marker;
acquiring pixel coordinates of the marker in the reference image and pixel coordinates of the marker in the observed image; and
calculating, based on differences between the pixel coordinates of the marker in the reference image and the pixel coordinates of the marker in the observed image, amounts of movement of the second specimen stage to move the second specimen stage.

According to the above-mentioned observation method, the observation target position of the specimen that has been observed with the first specimen observation apparatus can easily be observed through use of the second specimen observation apparatus. In addition, according to the above-mentioned observation method, there is no need to integrate a device capable of reading the stage coordinates into the first specimen observation apparatus, and the observation system including the first specimen observation apparatus and the second specimen observation apparatus can be implemented inexpensively.

(3) The above-mentioned observation method may further include photographing the observed image by the first specimen observation apparatus, the first specimen observation apparatus may further include a zoom mechanism capable of changing a magnification without moving a field of view, and the photographing the observed image may include:
observing the specimen at a first magnification to place the observation target position at a center of the field of view; and
changing, under a state in which the observation target position is placed at the center of the field of view, from the first magnification to a second magnification, which is lower than the first magnification, using the zoom mechanism to photograph the observed image.

According to the above-mentioned observation method, the observed image having the observation target position of the specimen positioned at the center thereof, and including the marker can be photographed easily.

(4) In the above-mentioned observation method, the first specimen observation apparatus and the second specimen observation apparatus may adopt observation techniques that are different from each other.

(5) According to one embodiment of the present invention, there is provided a specimen observation apparatus, which is used to observe an observation target position that has been observed with an external specimen observation apparatus including a first specimen stage, on which a specimen holder having a plurality of markers formed thereon is mountable, the specimen observation apparatus including:

a second specimen stage, on which the specimen holder is mountable;

an observed image acquisition unit configured to acquire an observed image that has been photographed by the external specimen observation apparatus with the specimen holder being mounted on the first specimen stage, the observed image having an observation target position of a specimen positioned at a center thereof, and including the plurality of markers;

a pixel coordinate acquisition unit configured to acquire pixel coordinates of each of the plurality of markers in the observed image;

a stage coordinate acquisition unit configured to acquire stage coordinates of each of the plurality of markers on the second specimen stage having the specimen holder mounted thereon; and a specimen stage control unit configured to convert, based on the pixel coordinates of the plurality of markers and the stage coordinates of the plurality of markers, pixel coordinates of the center of the observed image into stage coordinates to move the second specimen stage to the obtained stage coordinates.

According to the above-mentioned specimen observation apparatus, based on the observed image that has been photographed by the external specimen observation apparatus, the specimen stage can be moved to the observation target position of the specimen that has been observed with the external specimen observation apparatus. Therefore, according to the above-mentioned specimen observation apparatus, the observation target position of the specimen that has been observed with the external specimen observation apparatus can easily be observed.

(6) According to one embodiment of the present invention, there is provided a specimen observation apparatus, which is used to observe an observation target position that has been observed with an external specimen observation apparatus including a first specimen stage, on which a specimen holder having a marker formed thereon is mountable, the specimen observation apparatus including:

a second specimen stage, on which the specimen holder is mountable;

a reference image acquisition unit configured to acquire a reference image that has been photographed by the external specimen observation apparatus with the specimen holder being mounted on the first specimen stage such that a center of the first specimen stage and a reference point of the specimen holder match with each other, the reference image having the reference point of the specimen holder positioned at a center thereof, and including the marker;

an observed image acquisition unit configured to acquire an observed image that has been photographed by the external specimen observation apparatus with the specimen holder being mounted on the first specimen stage such that the center of the first specimen stage and the reference point of the specimen holder match with each other, the observed image having an observation target position of a specimen positioned at a center thereof, and including the marker;

a pixel coordinate acquisition unit configured to acquire pixel coordinates of the marker in the reference image and pixel coordinates of the marker in the observed image; and a specimen stage control unit configured to calculate, based on differences between the pixel coordinates of the marker in the reference image and the pixel coordinates of the marker in the observed image, amounts of movement of the second specimen stage to move the second specimen stage.

According to such specimen observation apparatus, based on the observed image that has been photographed by the external specimen observation apparatus, the specimen stage can be moved to the observation target position of the specimen that has been observed with the external specimen observation apparatus. Therefore, according to such specimen observation apparatus, the observation target position of the specimen that has been observed with the external specimen observation apparatus can easily be observed.

Exemplary embodiments of the present invention are described in detail below with reference to the drawings. The following exemplary embodiments do not unduly limit the scope of the present invention as stated in the claims. Further, all of the elements described below should not necessarily be taken as essential elements of the present invention.

Moreover, a scanning electron microscope is described below as an example of the specimen observation apparatus according to the present invention, but the specimen observation apparatus according to the present invention is not particularly limited as long as the apparatus can be used to observe the specimen. Examples of such specimen observation apparatus include a transmission electron microscope (TEM), a scanning transmission electron microscope (STEM), a focused ion beam (FIB) system, and an electron probe microanalyzer (EPMA).

1. First Embodiment 1.1. Scanning Electron Microscope

First, a scanning electron microscope according to a first embodiment of the present invention is described with reference to the drawing. Now, there is described an example in which the scanning electron microscope according to the first embodiment forms an observation system together with an optical microscope.

Figure 2:
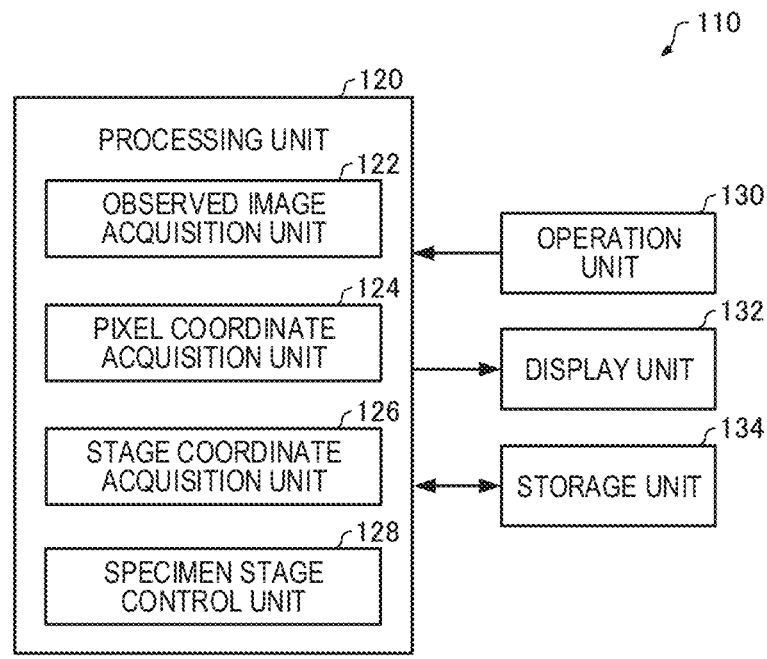
FIG. 2 is a functional block diagram of a control PC of the scanning electron microscope according to the first embodiment.

FIG. 1 is a functional block diagram of an observation system 1000 including a scanning electron microscope 100 according to a first embodiment of the present invention. FIG. 2 is a functional block diagram of a control PC 110 of the scanning electron microscope 100.

The observation system 1000 includes an optical microscope 10 and the scanning electron microscope 100. The observation system 1000 is a system configured to enable a spot that has been observed with the optical microscope 10 to be observed with the scanning electron microscope 100. In other words, with the observation system 1000, the same spot of a specimen can be observed with the optical microscope 10 and the scanning electron microscope 100.

The optical microscope 10 is a microscope utilizing visible rays. The optical microscope 10 is a stereoscopic microscope, for example. In the observation system 1000, the optical microscope 10 is used to determine an observation target position of the specimen. As illustrated in FIG. 1, the optical microscope 10 includes a CCD camera 12, a zoom mechanism 14, a specimen stage (first specimen stage) 16, and a control PC 18.

The CCD camera 12 photographs an image (observed image) of the specimen observed with the optical microscope 10. The observed image that has been photographed by the CCD camera 12 is recorded in the control PC 18.

The zoom mechanism 14 is a mechanism for magnifying or demagnifying the image observed with the optical microscope 10.

Figure 3:
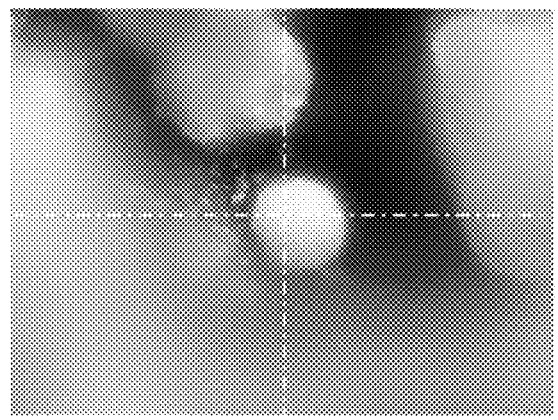
FIG. 3 is an observed image at a high magnification of an observation target position of a specimen that is photographed by an optical microscope.
Figure 4:
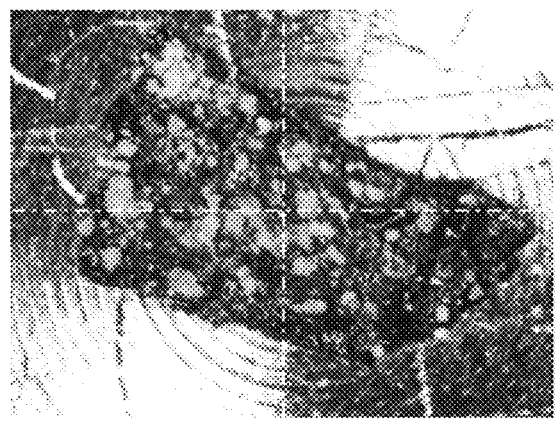
FIG. 4 is an observed image at a low magnification of the observation target position of the specimen that is photographed by the optical microscope.

FIG. 3 is an example of an observed image at a high magnification of the observation target position of a specimen S that is photographed by the optical microscope 10. FIG. 4 is an example of an observed image at a low magnification of the observation target position of the specimen S that is photographed by the optical microscope 10.

As illustrated in FIG. 3 and FIG. 4, in the optical microscope 10, the zoom mechanism 14 may be used to change a magnification without moving a field of view. In other words, in the optical microscope 10, when the zoom mechanism 14 is used to change from the high magnification to the low magnification, or from the low magnification to the high magnification, a position of a center of the image photographed by the CCD camera 12 is not shifted.

The specimen stage 16 is a manual specimen stage, for example. The optical microscope 10 does not need to have a function of reading coordinate information of the specimen stage 16. The specimen stage 16 is configured such that a specimen holder (specimen holder 20 to be described later), which is used in common with a specimen stage 102 of the scanning electron microscope 100, is mountable thereon.

The control PC 18 is configured to record the image photographed by the CCD camera 12.

Figure 5:
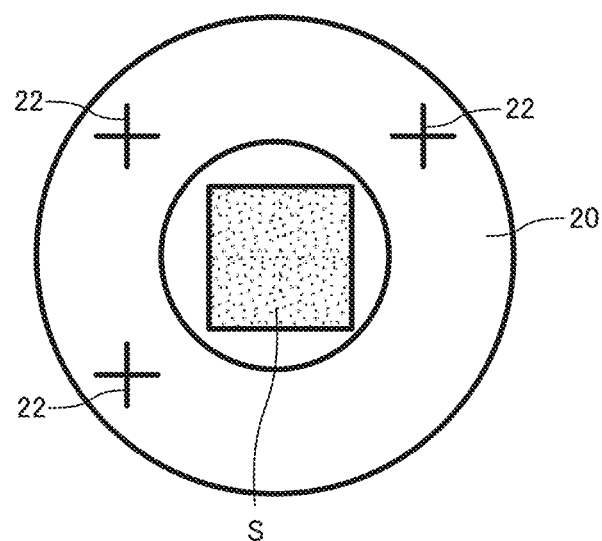
FIG. 5 is a plan view for schematically illustrating a specimen holder.

FIG. 5 is a plan view for schematically illustrating the specimen holder 20, which can be used in common with the optical microscope 10 and the scanning electron microscope 100.

As illustrated in FIG. 5, the specimen holder 20 has a plurality of (in the example illustrated in FIG. 5, three) markers 22 formed thereon. The number of markers 22 is set to a number with which, in the step of calculating coordinate conversion factors for converting pixel coordinates into stage coordinates, which is to be described later, the coordinate conversion factors can be determined. The markers 22 are formed to be identifiable with the optical microscope 10 and the scanning electron microscope 100. Shapes of the markers 22 are not particularly limited.

The scanning electron microscope 100 is an apparatus configured to scan a specimen surface with an electron beam, and detect and image electrons emitted from the specimen. In the observation system 1000, the scanning electron microscope 100 is used to observe the observation target position that has been observed with the optical microscope 10. As illustrated in FIG. 1, the scanning electron microscope 100 includes the specimen stage (second specimen stage) 102 and the control PC 110.

The specimen stage 102 is controlled by the control PC 110. The specimen stage 102 is configured such that the specimen holder 20 is mountable thereon. The specimen stage 102 is an electric motor stage, for example, and includes an X-axis motor and a Y-axis motor, which are not shown. Information on a position (stage coordinates) of the specimen stage 102 may be obtained with encoders attached to the X-axis motor and the Y-axis motor. The information on the position (stage coordinates) of the specimen stage 102 is recorded in the control PC 110.

The control PC 110 is configured to control components of the scanning electron microscope 100. The control PC 110 and the control PC 18 of the optical microscope 10 are connected to each other with a local area network (LAN), for example.

As illustrated in FIG. 2, the control PC 110 includes a processing unit (processor) 120, an operation unit 130, a display unit 132, and a storage unit (memory) 134.

The operation unit 130 is configured to perform processing of acquiring an operation signal corresponding to an operation by a user, and transmitting the operation signal to the processing unit 120. The operation unit 130 is a button, keys, a touch panel display, or a microphone, for example.

The display unit 132 is configured to display an image generated by the processing unit 120, and the function thereof may be implemented by a liquid crystal display (LCD) or a cathode ray tube (CRT), for example.

The storage unit 134 stores programs and data used by the processing unit 120 in performing various kinds of computation processing and control processing. Moreover, the storage unit 134 is used as a work area of the processing unit 120, and is also used to temporarily store results of calculation executed by the processing unit 120 in accordance with various programs, and other such data. The functions of the storage unit 134 may be implemented by a memory such as a hard disk and a random access memory (RAM).

The processing unit 120 is configured to perform processing of controlling the components of the scanning electron microscope 100 to observe and photograph an SEM image, processing of displaying the photographed SEM image on the display unit 132, processing of acquiring the observed image that has been photographed by the optical microscope 10 to move the specimen stage 102 to a position at which the observed image is photographed, and other such processing. The functions of the processing unit 120 may be implemented by executing programs by various processors (e.g., central processing unit (CPU)). The processing unit 120 includes an observed image acquisition unit 122, a pixel coordinate acquisition unit 124, a stage coordinate acquisition unit 126, and a specimen stage control unit 128.

The observed image acquisition unit 122 is configured to acquire the observed image that has been photographed by the optical microscope 10.

Figure 6:
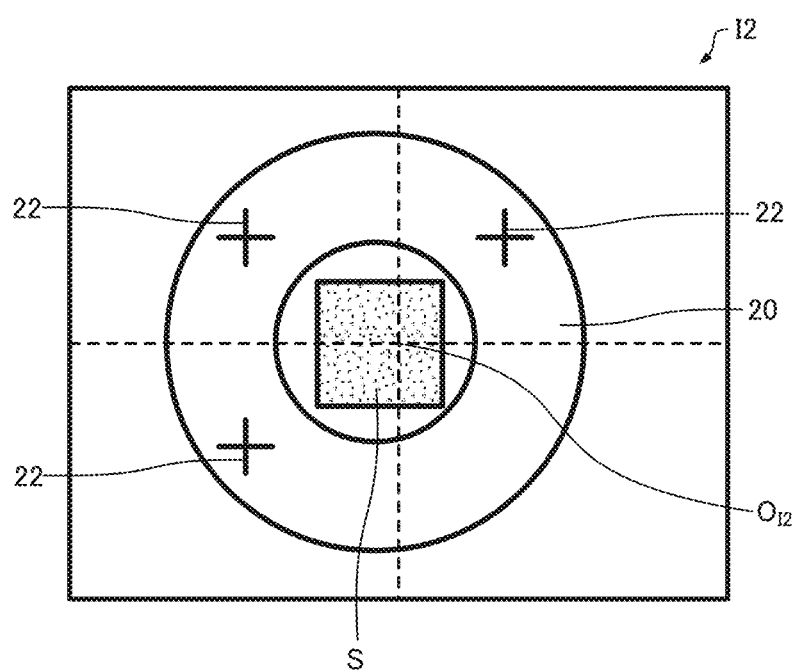
FIG. 6 is a diagram for schematically illustrating an observed image photographed by the optical microscope.

FIG. 6 is a diagram for schematically illustrating an observed image I2 photographed by the optical microscope 10. The observed image I2 is an image photographed by the optical microscope 10 under a state in which the specimen holder 20 is mounted on the specimen stage 16. The observed image I2 is an image including an observation target position (spot to be observed) of the specimen S. In the observed image I2, the observation target position of the specimen S is positioned at a center $O_{I2}$ of the observed image I2. The observed image I2 includes the plurality of (in the example illustrated in FIG. 6, three) markers 22 formed on the specimen holder 20.

The observed image acquisition unit 122 is configured to acquire the observed image I2 that has been recorded in the control PC 18 of the optical microscope 10 via a local area network (LAN) or the like, for example. The observed image acquisition unit 122 may acquire the observed image I2 by reading the observed image I2 from a recording medium or the like.

The pixel coordinate acquisition unit 124 is configured to acquire pixel coordinates of each of the plurality of markers 22 in the observed image I2. The pixel coordinates are coordinates for determining a position of a pixel forming the observed image I2. The acquisition of the pixel coordinates of the markers 22 in the observed image I2 is performed by the user specifying, via the operation unit 130, the markers 22 in the observed image I2 displayed on the display unit 132, for example. The acquisition of the pixel coordinates of the markers 22 may be performed by automatically detecting the markers 22 in the observed image I2.

The stage coordinate acquisition unit 126 is configured to acquire stage coordinates of each of the plurality of markers 22 on the specimen stage 102 having the specimen holder 20 mounted thereon. The stage coordinates on the specimen stage 102 are coordinates for determining a position of the specimen stage 102.

The specimen stage control unit 128 is configured to convert, based on the pixel coordinates of each of the plurality of markers 22 acquired by the pixel coordinate acquisition unit 124, and on the stage coordinates of each of the plurality of markers 22 acquired by the stage coordinate acquisition unit 126, pixel coordinates of the center $O_{I2}$ of the observed image I2 into stage coordinates on the specimen stage 102.

Specifically, the specimen stage control unit 128 calculates, based on the pixel coordinates of each of the plurality of markers 22 and the stage coordinates of each of the plurality of markers 22, the coordinate conversion factors through Affine transformation or other such methods. Then, the specimen stage control unit 128 converts, using the obtained coordinate conversion factors, the pixel coordinates of the center On of the observed image I2 (that is, pixel coordinates of the observation target position) into the stage coordinates on the specimen stage 102.

Pixel coordinates (X, Y) of the center $O_{I2}$ of the observed image I2 are expressed as $(X_A/2\ Y_A/2)$. $X_A$ is the number of pixels in an X direction of the observed image I2, and $Y_A$ is the number of pixels in a Y direction of the observed image I2. For example, when the observed image I2 has 640×480 pixels, the pixel coordinates (X, Y) of the center $O_{I2}$ of the observed image I2 are (640/2, 480/2).

The specimen stage control unit 128 is configured to move the specimen stage 102 to the stage coordinates obtained by converting the pixel coordinates of the center On of the observed image I2 with the coordinate conversion factors. In other words, the specimen stage control unit 128 is configured to move the specimen stage 102 such that the observation target position of the specimen S is positioned at a center of the field of view. As a result, the observation target position of the specimen S that has been observed with the optical microscope 10 can be observed with the scanning electron microscope 100.

Figure 7:
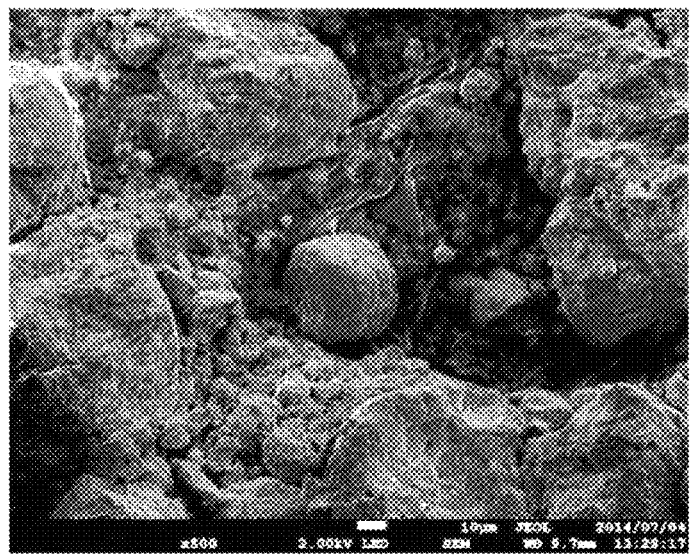
FIG. 7 is a scanning electron microscope (SEM) image photographed with a specimen stage moved to the observation target position in the scanning electron microscope according to the first embodiment.

FIG. 7 is the SEM image photographed with the specimen stage 102 moved to the observation target position in the scanning electron microscope 100.

The scanning electron microscope 100 has the following features, for example.

In the scanning electron microscope 100, the observed image acquisition unit 122 acquires the observed image I2 that has been photographed by the optical microscope 10, the observed image I2 having the observation target position of the specimen S positioned at the center $O_{I2}$, and including the plurality of markers 22. Further, the pixel coordinate acquisition unit 124 acquires the pixel coordinates of each of the plurality of markers 22 in the observed image I2, and the stage coordinate acquisition unit 126 acquires the stage coordinates of each of the plurality of markers 22 on the specimen stage 102 of the scanning electron microscope 100. Then, the specimen stage control unit 128 converts, based on the pixel coordinates of the plurality of markers 22 and the stage coordinates of the plurality of markers 22, the pixel coordinates of the center $O_{I2}$ of the observed image I2 into the stage coordinates to move the specimen stage 102 to the obtained stage coordinates.

Therefore, with the scanning electron microscope 100, based on the observed image I2 that has been photographed by the optical microscope 10, the specimen stage 102 can be moved to the observation target position of the specimen S that has been observed with the optical microscope 10. In other words, with the scanning electron microscope 100, there is no need for information on stage coordinates of the observation target position and stage coordinates of the markers 22 in the optical microscope 10 in moving the specimen stage 102 to the observation target position. Therefore, with the scanning electron microscope 100, the observation target position of the specimen S that has been observed with the optical microscope 10 can easily be observed.

Moreover, as described above, with the scanning electron microscope 100, there is no need for the information on the stage coordinates of the observation target position and the stage coordinates of the markers 22 in the optical microscope 10, and hence there is no need to integrate the device (e.g., electric motor stage) capable of reading the stage coordinates into the optical microscope 10, with the result that the observation system 1000 can be implemented easily and inexpensively.

1.2. Observation Method

Figure 8:
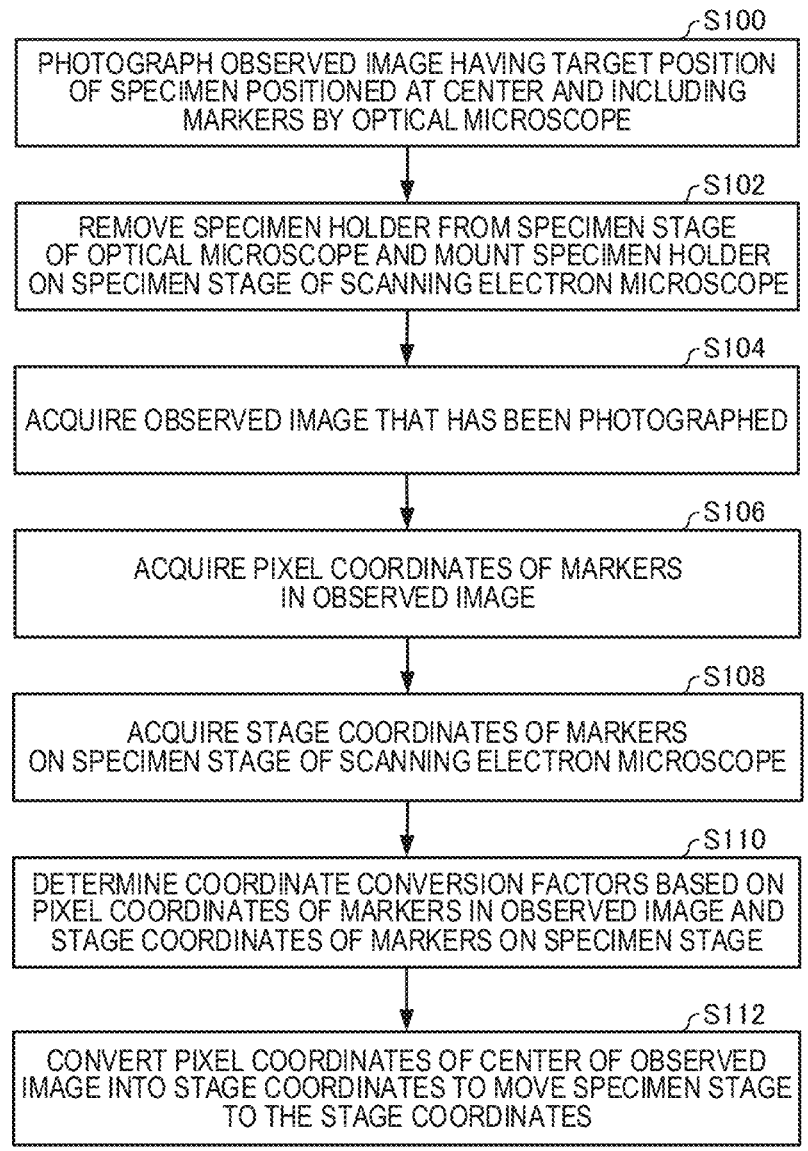
FIG. 8 is a flow chart for illustrating an example of an observation method according to the first embodiment.
Figure 9:
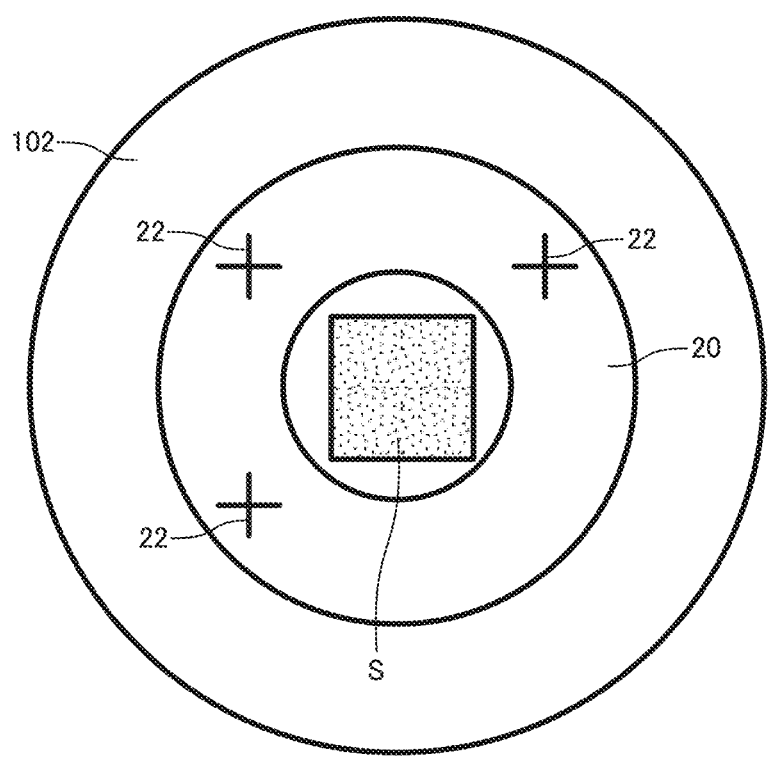
FIG. 9 is a diagram for illustrating the observation method according to the first embodiment.
Figure 10:
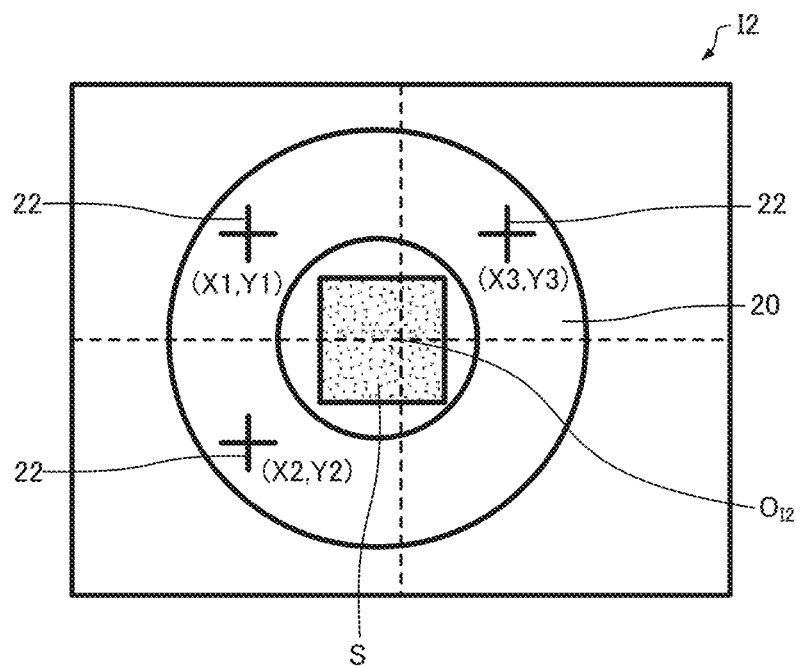
FIG. 10 is a diagram for illustrating the observation method according to the first embodiment.
Figure 11:
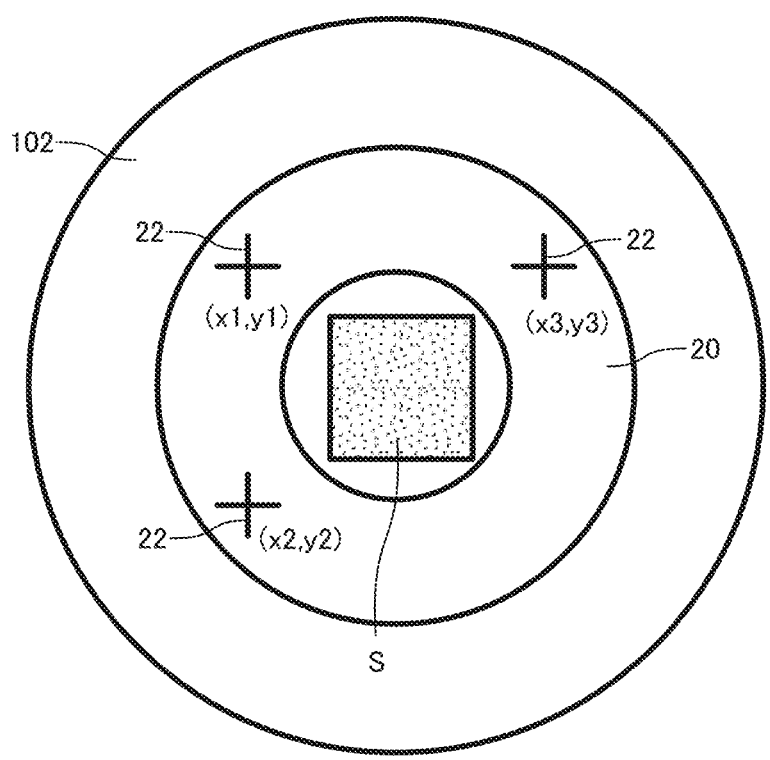
FIG. 11 is a diagram for illustrating the observation method according to the first embodiment.

Next, an observation method according to the first embodiment is described with reference to the drawings. FIG. 8 is a flow chart for illustrating an example of the observation method according to the first embodiment. FIG. 9 to FIG. 11 are diagrams for illustrating the observation method according to the first embodiment. As the observation method according to the first embodiment, an observation method using the observation system 1000 including the scanning electron microscope 100 is described below.

First, the observed image I2 (see FIG. 6) having the observation target position of the specimen S positioned at the center $O_{I2}$, and including the plurality of markers 22 is photographed by the optical microscope 10 (Step S100).

Specifically, first, the specimen holder 20 having the specimen S fixed thereon is mounted on the specimen stage 16 of the optical microscope 10. Next, the specimen S is observed with the optical microscope 10 while the specimen stage 16 is operated manually, to thereby determine the observation target position. Then, under a state in which the observation target position of the specimen S is positioned at the center of the field of view, the zoom mechanism 14 is used to zoom out, and the observed image I2 having the observation target position of the specimen S positioned at the center $O_{I2}$, and including the plurality of markers 22 is photographed with the CCD camera 12. The observed image I2 that has been photographed is recorded in the control PC 18.

In the optical microscope 10, the zoom mechanism 14 may be used to change from the high magnification to the low magnification without moving the position of the center of the field of view. Therefore, with the optical microscope 10, the zoom mechanism 14 may be used to photograph the observed image I2 having the observation target position of the specimen S positioned at the center $O_{I2}$, and including the plurality of markers 22 easily.

Next, the specimen holder 20 is removed from the specimen stage 16 of the optical microscope 10, and is mounted on the specimen stage 102 of the scanning electron microscope 100 as illustrated in FIG. 9 (Step S102). In a second embodiment of the present invention to be described later, the specimen holder 20 is mounted such that a center of the specimen stage 102 and a center of the specimen holder 20 match with each other, and that coordinate axes of stage coordinates on the specimen stage 16 and coordinate axes of stage coordinates on the specimen stage 102 of the scanning electron microscope 100 correspond to each other. In contrast, in the first embodiment, there is no such limitation, and the specimen holder 20 may be mounted on the specimen stage 102 at any position.

Next, the observed image acquisition unit 122 acquires the observed image I2 (Step S104).

Next, the pixel coordinate acquisition unit 124 acquires the pixel coordinates of each of the plurality of markers 22 in the observed image I2 (Step S106). As illustrated in FIG. 10, the specimen holder 20 has three markers 22 formed thereon, and hence the pixel coordinate acquisition unit 124 acquires the pixel coordinates (X, Y)=(X1, Y1), (X2, Y2), and (X3, Y3) of the three markers 22.

Next, the stage coordinate acquisition unit 126 acquires the stage coordinates of each of the plurality of markers 22 on the specimen stage 102 (Step S108). Each of the three markers 22 may be observed with the optical microscope 10 to acquire stage coordinates (x, y)=(x1, y1), (x2, y2), and (x3, y3) of the three markers 22 as illustrated in FIG. 11.

Next, the specimen stage control unit 128 calculates, based on the pixel coordinates (X1, Y1), (X2, Y2), and (X3, Y3) of the plurality of markers 22, respectively, and the stage coordinates (x1, y1), (x2, y2), and (x3, y3) of the plurality of markers 22, respectively, coordinate conversion factors for converting the pixel coordinates (X, Y) into the stage coordinates (x, y) (Step S110).

The specimen stage control unit 128 converts pixel coordinates $(X_A/2, Y_A/2)$ of the center On of the observed image I2 into stage coordinates on the specimen stage 102 using the obtained coordinate conversion factors to move the specimen stage 102 to the stage coordinates (Step S112). In this manner, the specimen stage 102 can be moved to the observation target position of the specimen S.

In the observation method described above, the order of the steps is not particularly limited. For example, the step of acquiring the observed image I2 that has been photographed (Step S104) and the step of acquiring the pixel coordinates of the markers 22 in the observed image I2 (Step S106) may be performed before the step of mounting the specimen holder 20 on the specimen stage 102 of the scanning electron microscope 100 (Step S102).

The observation method according to the first embodiment has the following features, for example.

The observation method according to the first embodiment includes: acquiring the observed image I2 having the observation target position of the specimen S positioned at the center $O_{I2}$, and including the plurality of markers 22; acquiring the pixel coordinates of each of the plurality of markers 22 in the observed image I2; acquiring the stage coordinates of each of the plurality of markers 22 on the specimen stage 102 of the scanning electron microscope 100 having the specimen holder 20 mounted thereon; and converting, based on the pixel coordinates of the plurality of markers 22 and the stage coordinates of the plurality of markers 22, the pixel coordinates of the center $O_{I2}$ of the observed image I2 into the stage coordinates to move the specimen stage 102 of the scanning electron microscope 100 to the obtained stage coordinates.

Therefore, with the observation method according to the first embodiment, there is no need for the information on the stage coordinates of the observation target position and the stage coordinates of the markers 22 in the optical microscope 10 in moving the specimen stage 102 to the observation target position. Therefore, with the observation method according to the first embodiment, the observation target position of the specimen S that has been observed with the optical microscope 10 can easily be observed.

The observation method according to the first embodiment further includes photographing the observed image I2 by the optical microscope 10, and the photographing the observed image I2 includes: observing the specimen S at a first magnification (high magnification) to place the observation target position at the center of the field of view; and changing, under the state in which the observation target position of the specimen S is placed at the center of the field of view, from the first magnification to a second magnification (low magnification), which is lower than the first magnification, using the zoom mechanism I4 to photograph the observed image I2 including the markers 22. Therefore, with the observation method according to the first embodiment, the observed image I2 having the observation target position of the specimen S positioned at the center $O_{I2}$, and including the markers 22 can be photographed easily.

2. Second Embodiment 2.1. Scanning electron microscope

Next, a scanning electron microscope according to the second embodiment is described with reference to the drawings. Now, there is described an example in which the scanning electron microscope according to the second embodiment forms an observation system together with an optical microscope.

Figure 12:
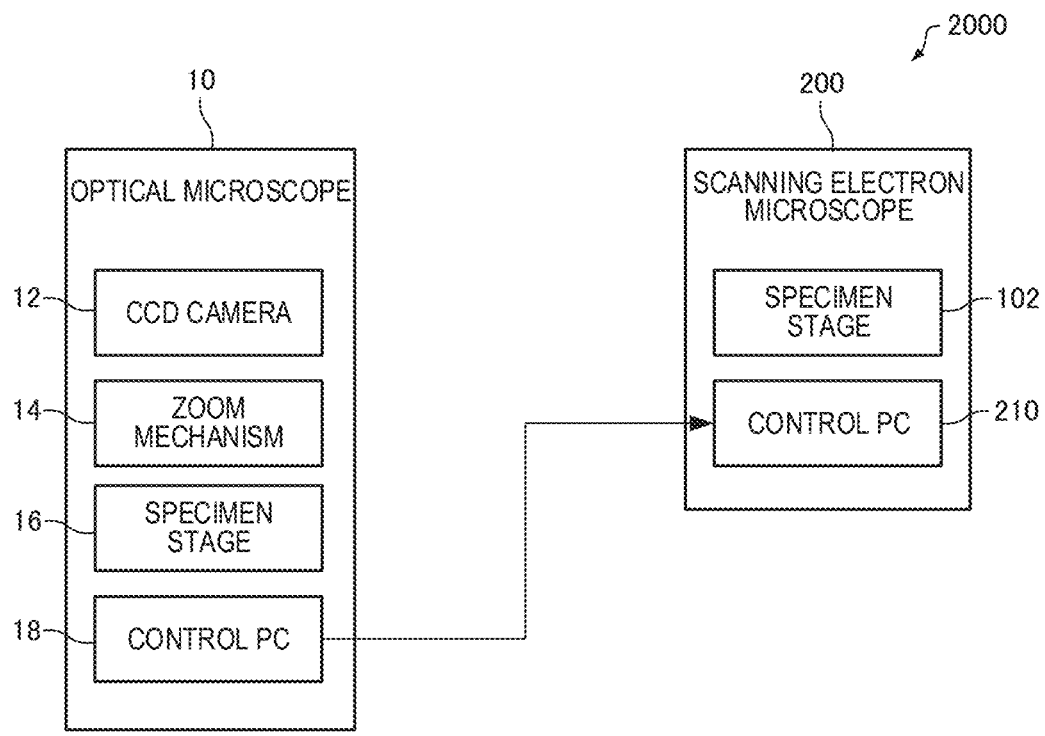
FIG. 12 is a functional block diagram of an observation system including a scanning electron microscope according to a second embodiment of the present invention.
Figure 13:
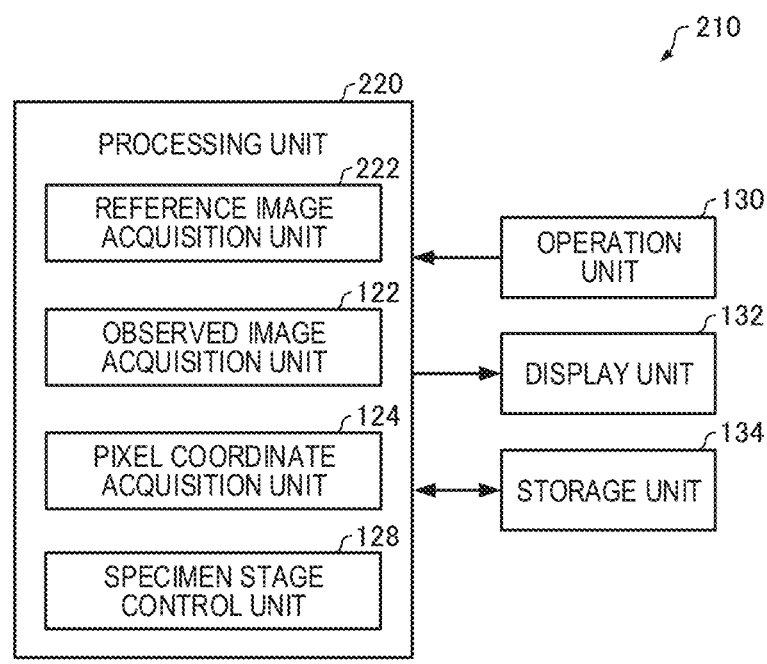
FIG. 13 is a functional block diagram of a control PC of the scanning electron microscope according to the second embodiment.

FIG. 12 is a functional block diagram of an observation system 2000 including a scanning electron microscope 200 according to the second embodiment. FIG. 13 is a functional block diagram of a control PC 210 of the scanning electron microscope 200. In the following, in the scanning electron microscope 200 according to the second embodiment, members having functions similar to constituent members of the scanning electron microscope 100 described above are denoted by the same reference symbols, and a detailed description thereof is omitted.

The scanning electron microscope 200 is different from the scanning electron microscope 100 illustrated in FIG. 1 and FIG. 2 described above in that, as illustrated in FIG. 12 and FIG. 13, a processing unit 220 of the control PC 210 includes a reference image acquisition unit 222. Further, the scanning electron microscope 200 is different from the scanning electron microscope 100 described above in that the processing unit 220 of the control PC 210 does not include the stage coordinate acquisition unit 126 (see FIG. 2).

The reference image acquisition unit 222 is configured to acquire a reference image that has been photographed by the optical microscope 10.

Figure 14:
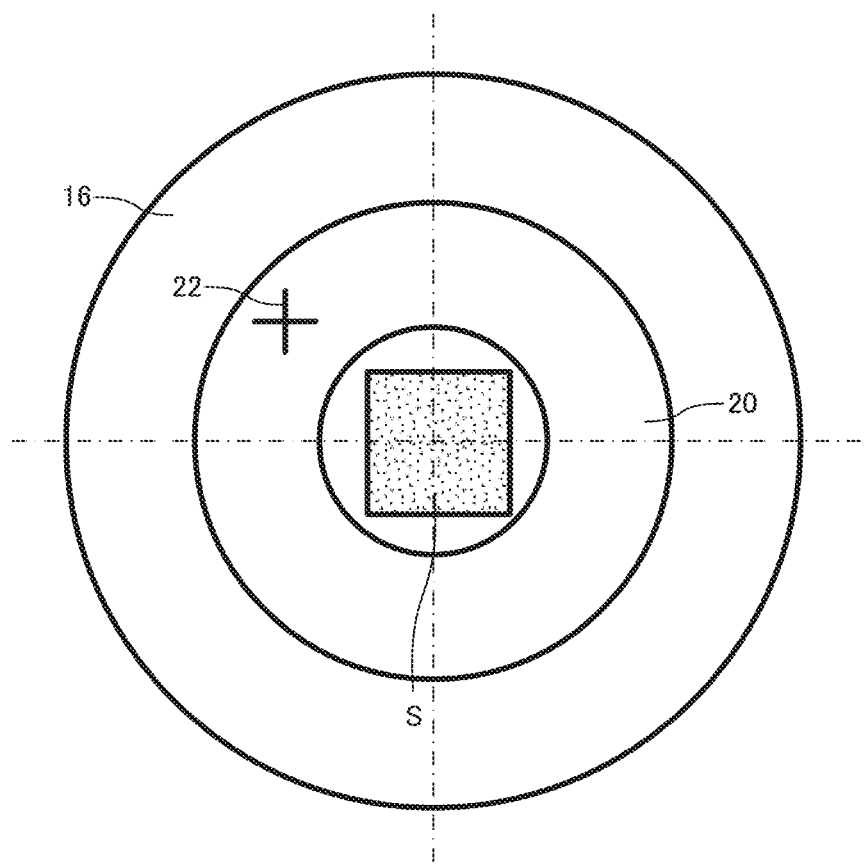
FIG. 14 is a diagram for schematically illustrating a state in which a specimen holder is mounted on a specimen stage of an optical microscope.
Figure 15:
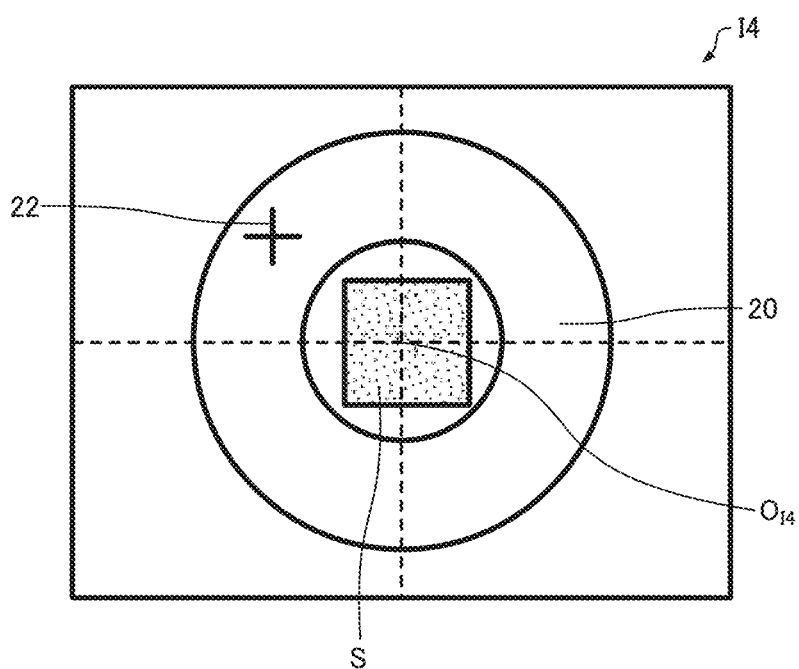
FIG. 15 is a diagram for schematically illustrating a reference image that is photographed by the optical microscope.

FIG. 14 is a diagram for schematically illustrating a state in which the specimen holder 20, which can be used in common in the optical microscope 10 and the scanning electron microscope 200, is mounted on the specimen stage 16 of the optical microscope 10. FIG. 15 is a diagram for schematically illustrating a reference image I4 that is photographed by the optical microscope 10.

As illustrated in FIG. 14, the specimen holder 20 has a marker 22 formed thereon. A position of the marker 22 is not particularly limited. In the first embodiment, the plurality of markers 22 have been formed on the specimen holder 20 to determine the coordinate conversion factors, but in the second embodiment, the number of markers 22 is one.

In planar view as illustrated in FIG. 14, the specimen holder 20 is mounted such that the center of the specimen stage 16 and the center of the specimen holder 20 match with each other. The center of the specimen stage 16 is a reference position of the specimen stage 16. Moving the specimen stage 16 to stage coordinates (a, b) means moving the center of the specimen stage 16 to the position of the stage coordinates (a, b). The center of the specimen stage 102, which is to be described later, is defined similarly to the center of the specimen stage 16.

The reference image I4 is an image photographed under the state in which the specimen holder 20 is mounted such that the center of the specimen stage 16 and the center of the specimen holder 20 match with each other. The reference image I4 is an image having the center of the specimen holder 20 positioned at a center $O_{I4}$ of the reference image I4, and including the marker 22.

The reference image acquisition unit 222 is configured to acquire the reference image I4 that has been recorded in the control PC 18 of the optical microscope 10 via a local area network (LAN) or the like, for example. The reference image acquisition unit 222 may acquire the reference image I4 by reading the reference image I4 from a recording medium or the like.

The observed image acquisition unit 122 is configured to acquire the observed image that has been photographed by the optical microscope 10.

Figure 16:
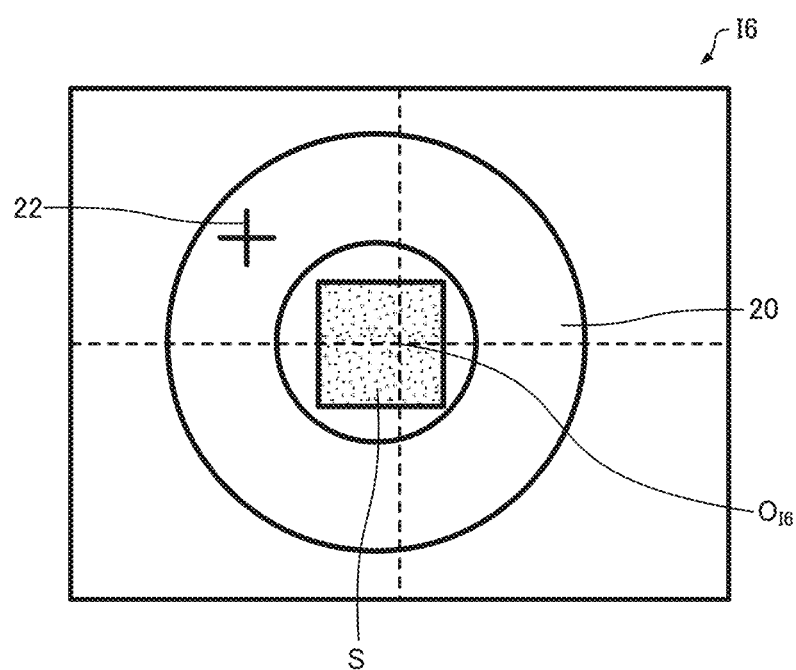
FIG. 16 is a diagram for schematically illustrating an observed image that is photographed by the optical microscope.

FIG. 16 is a diagram for schematically illustrating an observed image I6 photographed by the optical microscope 10. In the second embodiment, the observed image I6 is an image having the observation target position of the specimen S positioned at a center $O_{I6}$ thereof, and including the one marker 22. The observed image I6 is photographed under a photographing condition that is the same as that of the reference image I4. In other words, the observed image I6 is photographed under the state in which the specimen holder 20 is mounted such that the center of the specimen stage 16 and the center of the specimen holder 20 match with each other. Moreover, an observation magnification of the observed image I6 is the same as an observation magnification of the reference image I4.

The pixel coordinate acquisition unit 124 is configured to acquire pixel coordinates of the markers 22 in the reference image I4 and pixel coordinates of the markers 22 in the observed image I6.

The specimen stage control unit 128 calculates, based on differences between the pixel coordinates of the marker 22 in the reference image I4 and the pixel coordinates of the marker 22 in the observed image I6, amounts of movement on the specimen stage 102 to move the specimen stage 102.

The scanning electron microscope 200 has the following features, for example.

In the scanning electron microscope 200, the reference image acquisition unit 222 acquires the reference image I4 having the center of the specimen holder 20 positioned at the center $O_{I4}$, and including the marker 22, and the observed image acquisition unit 122 acquires the observed image I6 having the observation target position of the specimen S positioned at the center $O_{I6}$, and including the marker 22. Further, the pixel coordinate acquisition unit 124 acquires the pixel coordinates of the marker 22 in the reference image I4, and the pixel coordinates of the marker 22 in the observed image I6. Then, the specimen stage control unit 128 calculates, based on the differences between the pixel coordinates of the marker 22 in the reference image I4 and the pixel coordinates of the marker 22 in the observed image I6, the amounts of movement of the specimen stage 102 to move the specimen stage 102.

Therefore, according to the scanning electron microscope 200, actions and effects similar to those of the scanning electron microscope 100 can be obtained. In addition, with the scanning electron microscope 200, as opposed to the example of the scanning electron microscope 100, there is no need to form a plurality of markers 22 on the specimen holder 20. Moreover, with the scanning electron microscope 200, there is no need to acquire the stage coordinates of the marker 22.

2.2. Observation Method

Figure 17:
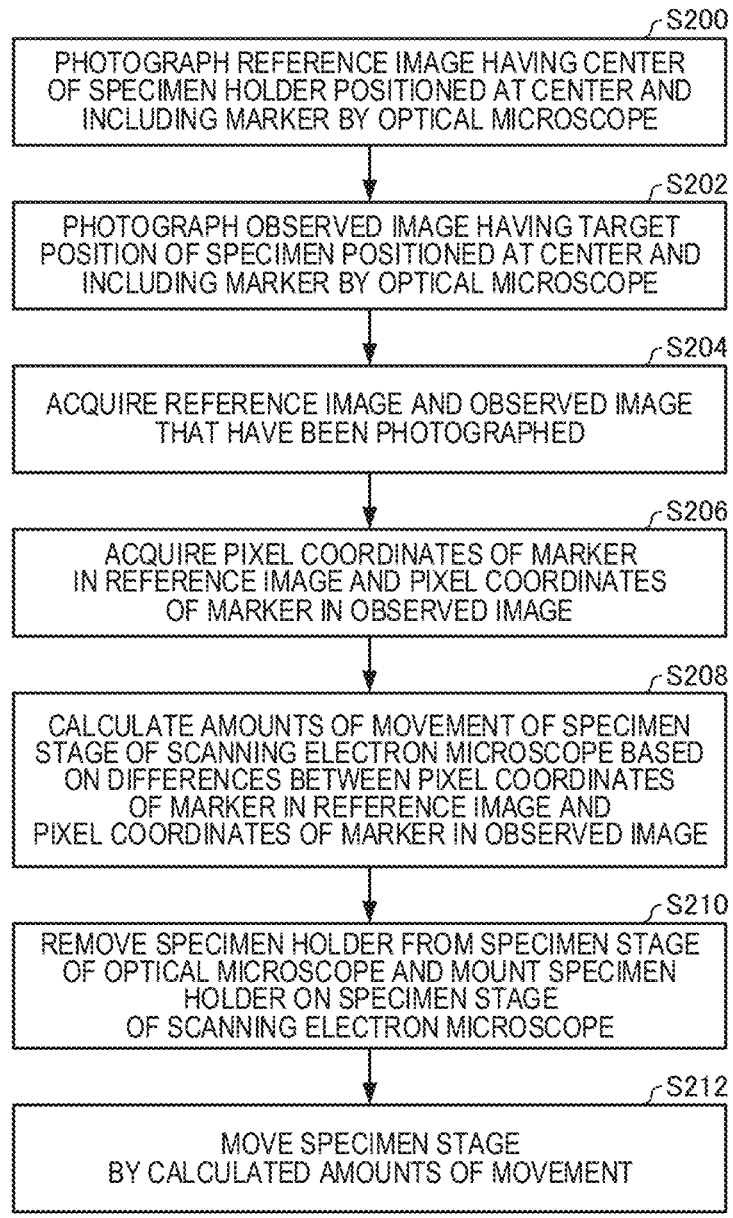
FIG. 17 is a flow chart for illustrating an example of an observation method according to the second embodiment.
Figure 18:
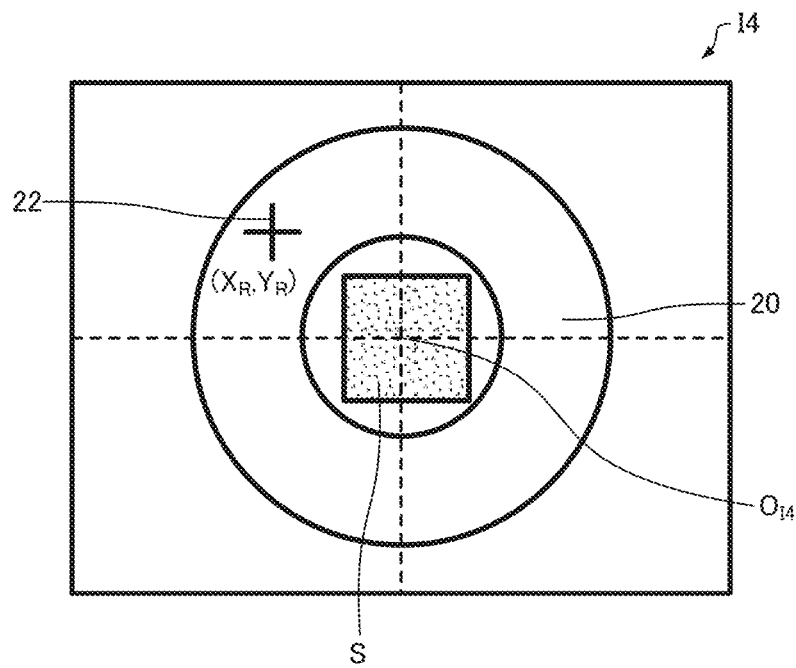
FIG. 18 is a diagram for illustrating the observation method according to the second embodiment.
Figure 19:
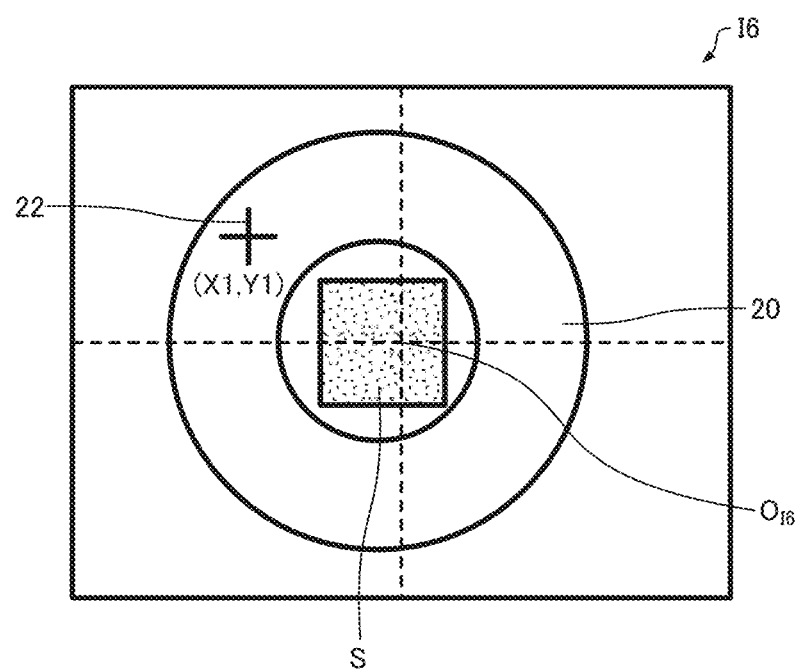
FIG. 19 is a diagram for illustrating the observation method according to the second embodiment.
Figure 20:
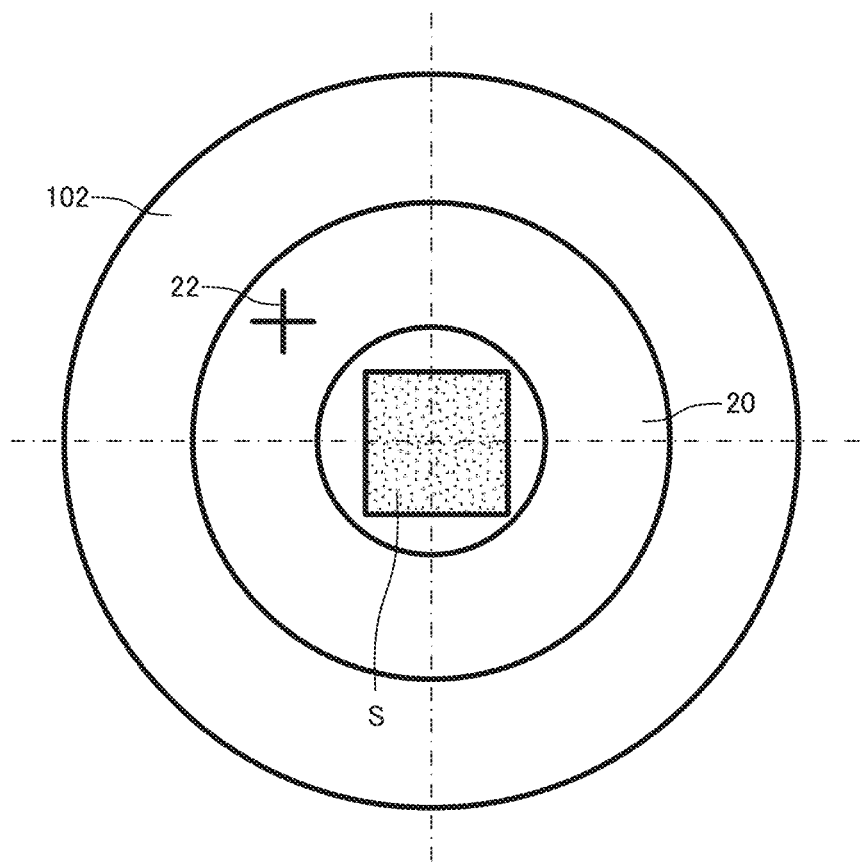
FIG. 20 is a diagram for illustrating the observation method according to the second embodiment.

Next, an observation method according to the second embodiment is described with reference to the drawings. FIG. 17 is a flow chart for illustrating an example of the observation method according to the second embodiment. FIG. 18 to FIG. 20 are diagrams for illustrating the observation method according to the second embodiment. As the observation method according to the second embodiment, an observation method using the observation system 2000 including the scanning electron microscope 200 is described below.

First, the reference image I4 (see FIG. 15) having the center of the specimen S positioned at the center $O_{I4}$, and including the markers 22 is photographed by the optical microscope 10 (Step S200).

Specifically, first, the specimen holder 20 having the specimen S fixed thereon is mounted on the specimen stage 16 of the optical microscope 10. At this time, the specimen holder 20 is mounted on the specimen stage 16 such that the center of the specimen holder 20 and the center of the specimen stage 16 match with each other. Then, the reference image I4 having the center of the specimen holder 20 positioned at the center $O_{I4}$, and including the marker 22 is photographed with the CCD camera 12. The reference image I4 that has been photographed is recorded in the control PC 18.

Next, the observed image I6 having the observation target position of the specimen S positioned at the center $O_{I6}$, and including the marker 22 is photographed with the optical microscope 10 (Step S202). Step S202 is performed similarly to Step S100 described above.

Next, the observed image acquisition unit 122 acquires the reference image I4 and the observed image I6 (Step S204).

Next, the pixel coordinate acquisition unit 124 acquires the pixel coordinates of the marker 22 in the reference image I4 and the pixel coordinates of the marker 22 in the observed image I6 (Step S206).

As illustrated in FIG. 18 and FIG. 19, the pixel coordinate acquisition unit 124 acquires pixel coordinates $(X_R, Y_R)$ of the marker 22 in the reference image I4, and pixel coordinates (X1, Y1) of the marker 22 in the observed image I6.

Next, the specimen stage control unit 128 calculates the amounts of movement of the specimen stage 102 based on the differences ($\Delta X$, $\Delta Y$) between the pixel coordinates $(X_R, Y_R)$ of the marker 22 in the reference image I4 and the pixel coordinates (X1, Y1) of the marker 22 in the observed image I6 (Step S208).

Specifically, the specimen stage control unit 128 first calculates the differences ($\Delta X$, $\Delta Y$) between the pixel coordinates $(X_R, Y_R)$ and the pixel coordinates (X1, Y1) (provided that $\Delta X = X_R - X1$, and $\Delta Y = Y_R - Y1$). Then, based on the differences ($\Delta X$, $\Delta Y$) between the coordinates, and a pixel pitch P (size of one pixel, gm/pixels) at the magnification at which the reference image I4 and the observed image I6 have been photographed, amounts of movement $(\Delta x, \Delta y)=(\Delta X \times P, \Delta X \Delta P)$ of the specimen stage 102 are calculated.

Next, the specimen holder 20 is removed from the specimen stage 16 of the optical microscope 10, and is mounted on the specimen stage 102 of the scanning electron microscope 100 (Step S210). As illustrated in FIG. 20, the specimen holder 20 is mounted such that the center of the specimen stage 102 and the center of the specimen holder 20 match with each other. Moreover, the specimen holder 20 is mounted such that the coordinate axes of the stage coordinates on the specimen stage 16 of the optical microscope 10 and the coordinate axes of the stage coordinates on the specimen stage 102 of the scanning electron microscope 100 correspond to each other.

Next, the specimen stage control unit 128 moves the specimen stage 102 by the calculated amounts of movement $(\Delta x, \Delta y)=(\Delta X \times P, \Delta Y \times P)$. As a result, the specimen stage 102 can be moved to the observation target position of the specimen S.

In the observation method described above, the order of the steps is not particularly limited. For example, before the step of acquiring the reference image I4 and the observed image I6 that have been photographed (Step S204), the step of mounting the specimen holder 20 on the specimen stage 102 of the scanning electron microscope 100 (Step S210) may be performed.

The observation method according to the second embodiment has the following features, for example.

The observation method according to the second embodiment includes: acquiring a reference image I4 that has been photographed by the optical microscope 10 with the specimen holder 20 being mounted on the specimen stage 16 such that a center of the specimen stage 16 of the optical microscope 10 and a center of the specimen holder 20 match with each other, the reference image I4 having the center of the specimen holder 20 positioned at a center $O_{I4}$, and including the marker 22; acquiring an observed image I6 that has been photographed by the optical microscope 10 with the specimen holder 20 being mounted on the specimen stage 16 such that the center of the specimen stage 16 and the center of the specimen holder 20 match with each other, the observed image I6 having an observation target position of a specimen S positioned at a center $O_{I6}$, and including the marker 22; acquiring pixel coordinates of the marker 22 in the reference image I4 and pixel coordinates of the marker 22 in the observed image I6; and calculating, based on differences between the pixel coordinates of the marker 22 in the reference image I4 and the pixel coordinates of the marker 22 in the observed image I6, amounts of movement of the specimen stage 16 of the scanning electron microscope 100 to move the specimen stage 16.

Therefore, according to the observation method of the second embodiment, the actions and effects similar to those of the observation method according to the first embodiment described above can be obtained.

In the above description, there has been described the case in which the specimen holder 20 is mounted on the specimen stage 16, 102 such that the center of the specimen stage 16, 102 and the center of the specimen holder 20 match with each other, but the specimen holder 20 may be mounted on the specimen stage 16, 102 such that the center of the specimen stage 16, 102 and a suitable spot (reference point) of the specimen holder 20 match with each other. In other words, as long as the same spot (reference point) of the specimen holder 20 matches with the center of the specimen stage 16, 102 in mounting the specimen holder 20 on each of the specimen stage 16 and the specimen stage 102, the reference point is not limited to the center of the specimen holder 20. For example, signs for mounting the reference point of the specimen holder 20 at the center of the specimen stage 16, 102 may be formed on the specimen holder 20 and the specimen stage 16, 102.

2.3. Modification Example

Figure 21:
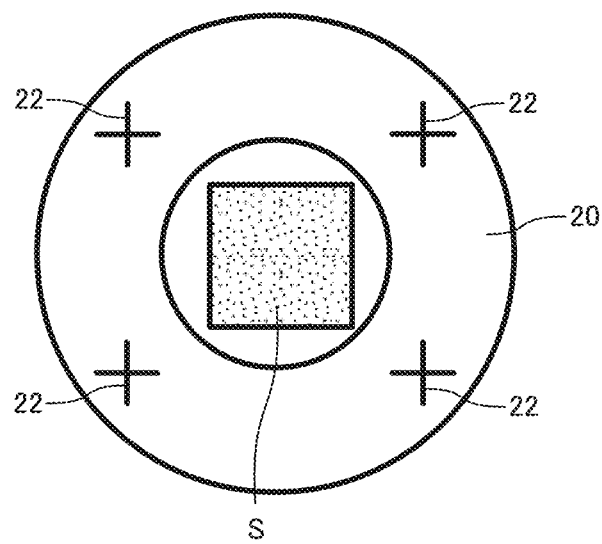
FIG. 21 is a plan view for schematically illustrating a specimen holder used in an observation method according to a modification of the second embodiment.
Figure 22:
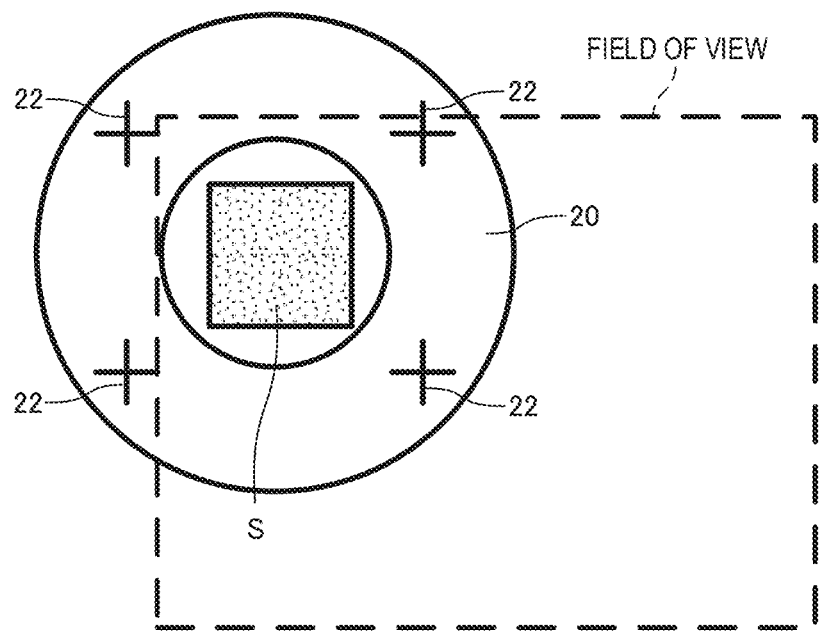
FIG. 22 is a diagram for illustrating a function of the specimen holder used in the observation method according to the modification of the second embodiment.
Figure 23:
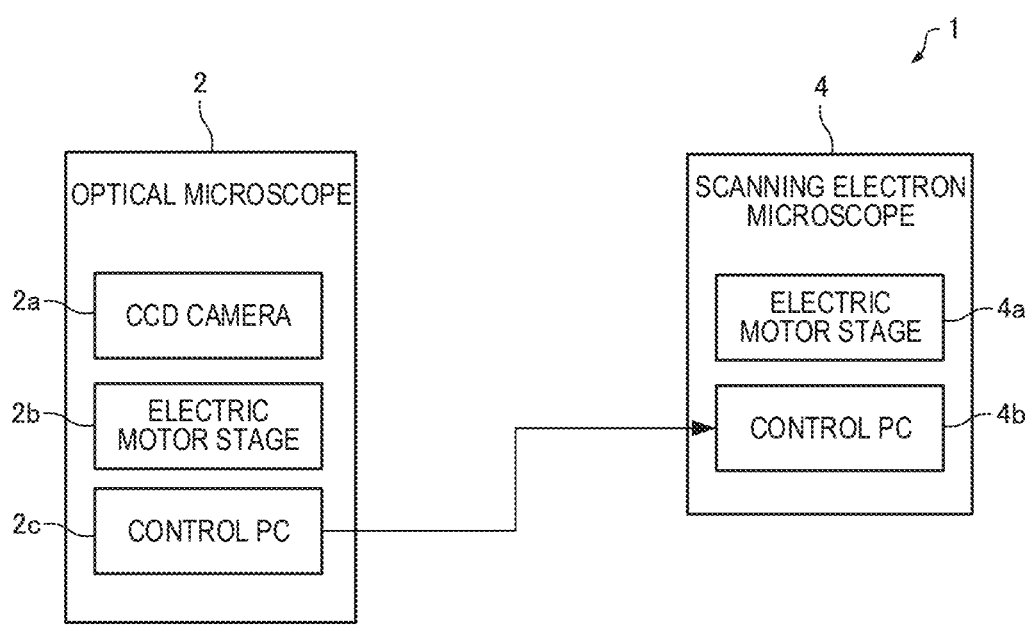
FIG. 23 is a functional block diagram of an observation system according to the related art.

Next, a modification example of the observation method according to the second embodiment is described with reference to the drawing. FIG. 21 is a plan view for schematically illustrating the specimen holder 20 used in an observation method according to a modification example of the second embodiment. FIG. 22 is a diagram for illustrating a function of the specimen holder 20 used in the observation method according to the modification example of the second embodiment. Points different from those of the second embodiment described above are described below, and a description on points similar to those of the second embodiment is omitted.

In the second embodiment described above, the specimen holder 20 has one marker 22 as illustrated in FIG. 14, but the specimen holder 20 may have a plurality of markers 22 as illustrated in FIG. 21. In the example illustrated in FIG. 21, the number of markers 22 is four, but the number is not particularly limited.

In the observation method according to the second embodiment described above, the marker 22 needs to be contained in the field of view when the observed image I6 is photographed. However, when the observation target position of the specimen S is at an end of the specimen S, there may be a case in which the marker 22 and the observation target position of the specimen S cannot be contained in the observed image I6. When the plurality of markers 22 are formed on the specimen holder 20 as illustrated in FIG. 22, such problem does not occur. A relative position of each of the plurality of markers 22 is determined in advance. As a result, as long as at least one marker 22 is contained in the observed image I6, the amounts of movement of the specimen stage 102 can be calculated as with the observation method according to the second embodiment described above.

The present invention is not limited to the above-mentioned embodiments, and may be modified and embodied in various ways within the gist of the present invention.

For example, in the observation method according to each of the first and second embodiments described above, there has been described the case in which the observation is performed using the optical microscope 10 and the scanning electron microscope 100, 200, but the observation method according to the present invention is not limited to the combination. The observation method according to the present invention is applicable to any two specimen observation apparatus (first specimen observation apparatus and second specimen observation apparatus) adopting observation techniques that are different from each other.

For example, in the embodiments described above, the optical microscope (stereoscopic microscope) is described as an example of the first specimen observation apparatus, but as the first specimen observation apparatus, there may be used various microscopes, such as a laser microscope and a metallurgical microscope, and various specimen observation apparatus, such as a transmission electron microscope (TEM), a scanning transmission electron microscope (STEM), a focused ion beam (FIB) system, and an electron probe microanalyzer (EPMA). Moreover, as the second specimen observation apparatus, there may be used a transmission electron microscope (TEM), a scanning transmission electron microscope (STEM), a focused ion beam (FIB) system, or an electron probe microanalyzer (EPMA), for example.

The embodiments and the modification example described above are merely examples, and the present invention is not limited thereto. For example, the respective embodiments and the modification example may be combined appropriately.

The present invention includes various other configurations substantially the same as the configurations described above in connection with the first embodiment and the second embodiment (e.g., a configuration having the same function, method, and results, or a configuration having the same object and effects). The present invention also includes a configuration in which an unsubstantial element described above in connection with the first embodiment and the second embodiment is replaced by another element. The present invention also includes a configuration having the same effects as those of the configurations described above in connection with the first embodiment and the second embodiment, or a configuration capable of achieving the same object as that of the configurations described above in connection with the first embodiment and the second embodiment. The present invention further includes a configuration in which a known technology is added to the configurations described in connection with the first embodiment and the second embodiment.

Although only some embodiments of the present invention have been described in detail above, those skilled in the art would readily appreciate that many modifications are possible in the embodiments without materially departing from the novel teachings and advantages of the present invention. Accordingly, all such modifications are intended to be included within the scope of the present invention.

What is claimed is:

1. An observation method, in which a first specimen observation apparatus including a first specimen stage, on which a specimen holder having a plurality of markers formed thereon is mountable, and a second specimen observation apparatus including a second specimen stage, on which the specimen holder is mountable, are used to observe a spot that has been observed with the first specimen observation apparatus through use of the second specimen observation apparatus, the observation method comprising:
acquiring an observed image that has been photographed by the first specimen observation apparatus with the specimen holder being mounted on the first specimen stage, the observed image having an observation target position of a specimen positioned at a center thereof, and including the plurality of markers;
acquiring pixel coordinates of each of the plurality of markers in the observed image;
acquiring stage coordinates of each of the plurality of markers on the second specimen stage having the specimen holder mounted thereon;
calculating coordinate conversion factors based on the acquired pixel coordinates of the plurality of markers in the observed image and the stage coordinates of the plurality of markers acquired by the second specimen stage, wherein the coordinate conversion factors are calculated without reference to stage coordinates of the first specimen observation apparatus; and
converting, based on the pixel coordinates of the plurality of markers and the stage coordinates of the plurality of markers, pixel coordinates of the center of the observed image into stage coordinates using the coordinate conversion factors to move the second specimen stage to the obtained stage coordinates, wherein the first specimen observation apparatus is an optical microscope and the second specimen observation apparatus is a scanning electron microscope.

2. The observation method according to claim 1, further comprising photographing the observed image by the first specimen observation apparatus,
wherein the first specimen observation apparatus further includes a zoom mechanism capable of changing a magnification without moving a field of view, and
wherein the photographing the observed image comprises:
observing the specimen at a first magnification to place the observation target position at a center of the field of view; and
changing, under a state in which the observation target position is placed at the center of the field of view, from the first magnification to a second magnification, which is lower than the first magnification, using the zoom mechanism to photograph the observed image.

3. The observation method according to claim 1, wherein the first specimen observation apparatus and the second specimen observation apparatus adopt observation techniques that are different from each other.

4. An observation method, in which a first specimen observation apparatus including a first specimen stage, on which a specimen holder having a marker formed thereon is mountable, and a second specimen observation apparatus including a second specimen stage, on which the specimen holder is mountable, are used to observe a spot that has been observed with the first specimen observation apparatus through use of the second specimen observation apparatus, the observation method comprising:
acquiring a reference image that has been photographed by the first specimen observation apparatus with the specimen holder being mounted on the first specimen stage such that a center of the first specimen stage and a reference point of the specimen holder match with each other, the reference image having the reference point of the specimen holder positioned at a center thereof, and including the marker;
acquiring an observed image that has been photographed by the first specimen observation apparatus with the specimen holder being mounted on the first specimen stage such that the center of the first specimen stage and the reference point of the specimen holder match with each other, the observed image having an observation target position of a specimen positioned at a center thereof, and including the marker;
acquiring pixel coordinates of the marker in the reference image and pixel coordinates of the marker in the observed image; and
calculating, based on differences between the pixel coordinates of the marker in the reference image and the pixel coordinates of the marker in the observed image, amounts of movement of the second specimen stage to move the second specimen stage.

5. The observation method according to claim 4, further comprising photographing the observed image by the first specimen observation apparatus,
wherein the first specimen observation apparatus further includes a zoom mechanism capable of changing a magnification without moving a field of view, and wherein the photographing the observed image comprises:
  observing the specimen at a first magnification to place the observation target position at a center of the field of view; and
  changing, under a state in which the observation target position is placed at the center of the field of view, from the first magnification to a second magnification, which is lower than the first magnification, using the zoom mechanism to photograph the observed image.

6. The observation method according to claim 4, wherein the first specimen observation apparatus and the second specimen observation apparatus adopt observation techniques that are different from each other.

7. A specimen observation apparatus, which is used to observe an observation target position that has been observed with an external specimen observation apparatus including a first specimen stage, on which a specimen holder having a plurality of markers formed thereon is mountable, the specimen observation apparatus comprising:
  a second specimen stage, on which the specimen holder is mountable;
  an observed image acquisition unit configured to acquire an observed image that has been photographed by the external specimen observation apparatus with the specimen holder being mounted on the first specimen stage, the observed image having an observation target position of a specimen positioned at a center thereof, and including the plurality of markers;
  a pixel coordinate acquisition unit configured to acquire pixel coordinates of each of the plurality of markers in the observed image;
  a stage coordinate acquisition unit configured to acquire stage coordinates of each of the plurality of markers on the second specimen stage having the specimen holder mounted thereon; and
  a specimen stage control unit configured to calculate coordinate conversion factors based on the acquired pixel coordinates of the plurality of markers in the observed image and the acquired stage coordinates of the plurality of markers on the second specimen stage and to convert, based on the acquired pixel coordinates of the plurality of markers in the observed image and the acquired stage coordinates of the plurality of markers on the second specimen stage, pixel coordinates of the center of the observed image into stage coordinates on the second specimen stage using the coordinate conversion factors to move the second specimen stage to the obtained stage coordinates, wherein the external specimen observation apparatus is an optical microscope and the specimen observation apparatus is a scanning electron microscope, and wherein the coordinate conversion factors are calculated without reference to stage coordinates of the first specimen observation apparatus.

8. A specimen observation apparatus, which is used to observe an observation target position that has been observed with an external specimen observation apparatus including a first specimen stage, on which a specimen holder having a marker formed thereon is mountable,
  the specimen observation apparatus comprising:
  a second specimen stage, on which the specimen holder is mountable;
  a reference image acquisition unit configured to acquire a reference image that has been photographed by the external specimen observation apparatus with the specimen holder being mounted on the first specimen stage such that a center of the first specimen stage and a reference point of the specimen holder match with each other, the reference image having the reference point of the specimen holder positioned at a center thereof, and including the marker;
  an observed image acquisition unit configured to acquire an observed image that has been photographed by the external specimen observation apparatus with the specimen holder being mounted on the first specimen stage such that the center of the first specimen stage and the reference point of the specimen holder match with each other, the observed image having an observation target position of a specimen positioned at a center thereof, and including the marker;
  a pixel coordinate acquisition unit configured to acquire pixel coordinates of the marker in the reference image and pixel coordinates of the marker in the observed image; and
  a specimen stage control unit configured to calculate, based on differences between the pixel coordinates of the marker in the reference image and the pixel coordinates of the marker in the observed image, amounts of movement of the second specimen stage to move the second specimen stage.

* * * * *

UNITED STATES PATENT AND TRADEMARK OFFICE
CERTIFICATE OF CORRECTION

| | |
|---|---|
| PATENT NO. | : 10,809,515 B2 |
| APPLICATION NO. | : 15/716914 |
| DATED | : October 20, 2020 |
| INVENTOR(S) | : Katsuyuki Suzuki et al. |

Page 1 of 1

It is certified that error appears in the above-identified patent and that said Letters Patent is hereby corrected as shown below:

On the Title Page

Column 1, Item (71), Line 1, after "JEOL Ltd., Tokyo (JP)" insert -- NIKON CORPORATION, Tokyo (JP) --

Column 1, Item (72), Line 1, after "Katsuyuki Suzuki, Tokyo (JP)" insert -- Takao Nonaka, Tokyo (JP) --

Signed and Sealed this
Thirteenth Day of August, 2024

Katherine Kelly Vidal
*Director of the United States Patent and Trademark Office*